(12) United States Patent
Joshi et al.

(10) Patent No.: US 7,719,135 B2
(45) Date of Patent: *May 18, 2010

(54) MULTI-LEVEL POWER SUPPLY SYSTEM FOR A COMPLEMENTARY METAL OXIDE SEMICONDUCTOR CIRCUIT

(75) Inventors: Rajiv V Joshi, Yorktown Heights, NY (US); Louis L Hsu, Fishkil, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/145,622

(22) Filed: Jun. 25, 2008

(65) Prior Publication Data
US 2008/0258555 A1  Oct. 23, 2008

Related U.S. Application Data

(63) Continuation of application No. 10/867,094, filed on Jun. 14, 2004, now Pat. No. 7,408,269.

(51) Int. Cl.
*H02J 1/10* (2006.01)
(52) U.S. Cl. ............................................. 307/18; 12/12

(58) Field of Classification Search .................... 307/18
See application file for complete search history.

(56) References Cited

U.S. PATENT DOCUMENTS 6,333,642 B1   12/2001  Kurisu
7,408,269 B2 *  8/2008  Joshi et al. ..................... 307/18

OTHER PUBLICATIONS

Microchip, AN763, Feb. 5, 2003.

* cited by examiner

*Primary Examiner*—Robert L. Deberadinis
(74) *Attorney, Agent, or Firm*—Ohlandt, Greeley, Ruggiero & Perle, L.L.P.; Brian P. Verminsky, Esq.

(57) ABSTRACT

There is provided a circuit for managing a multi-level power supply. The circuit includes a comparator that compares a voltage level (Vs1) of a lower voltage supply bus to a voltage level (Vs2) of a higher voltage supply bus, and a switch that routes current from the lower voltage supply bus to the higher voltage supply bus if Vs2<Vs1. The comparator is powered by the lower voltage supply bus, the lower and higher voltage supply busses provide power to an apparatus that includes a plurality of p-type metal oxide semiconductor devices in a common well, and the common well is electrically connected to the higher voltage supply bus.

6 Claims, 6 Drawing Sheets

MULTI-LEVEL POWER SUPPLY SYSTEM FOR A COMPLEMENTARY METAL OXIDE SEMICONDUCTOR CIRCUIT

CROSS-REFERENCE TO RELATED APPLICATIONS

The present application is a continuation of U.S. patent application Ser. No. 10/867,094, filed Jun. 14, 2004 now U.S. Pat. No. 7,408,269.

BACKGROUND OF THE INVENTION

1. Field of the Invention

The present invention relates to a multi-level power supply, and more particularly, to a technique of managing a multi-level power supply to avoid a latch-up of a complementary metal oxide semiconductor (CMOS) circuit.

2. Description of the Related Art

A semiconductor integrated circuit may include numerous active and passive devices. For example, the circuit may include active devices such as transistors, diodes, and thyristors, and passive devices such as capacitors, resistors and inductors. During manufacturing, extra devices may be inadvertently created. These extra devices are referred to as parasitic devices. The parasitic devices are not usually turned on during normal operation of the circuit, and current gain of parasitic pnp and npn bipolar transistors is normally very small.

However, in some circumstances, such as during a power-on period, the parasitic devices can be activated. This is because in an electronic system may include more than one level of power supply. During the power-on period, if a power supply with a lower voltage level comes on earlier than a power supply with a higher voltage level, a p-n junction could be forward biased. A parasitic pnp and npn, together, form a p-n-p-n thyristor. If the thyristor is connected between a power supply and an electrical ground, forward biasing of the p-n junction turns on the parasitic pnp and npn devices, which results in a high current flow from power supply to ground. A latch-up is a situation where the thyristor is triggered during the power-on period and causes a high current to flow from the power supply to ground. As a result of such high current, other circuits can be damaged, e.g., a melt down of metal wires. A detailed description of latch-up can be found in R. R. Troutman, "Latchup in CMOS Technology", Kluwer Academic Publishers, Boston, 1986.

A CMOS circuit built on a bulk silicon wafer is susceptible to latch-up. When latch-up conditions are met, a low-impedance path, e.g., through p-n-p-n junctions, is established between a power supply and ground. Once latch-up occurs, not only may circuits cease to function, but the latch-up may also induce catastrophic failure from joule heating. Ordinarily, the latch-up cannot be stopped unless power is removed and the circuits are reactivated.

To power-on a system having multiple-voltage supplies, if one supply is ramped up faster (or slower) than another, it is possible that some p-n junctions may be unintentionally forward biased, and the system could enter the latch-up situation. A body of a MOS device is an area beneath a channel of the MOS device and between a source and drain of the device. A body of a p-type metal oxide semiconductor (pMOS) device is tied to a higher voltage level than that of the pMOS device's source/drain junctions. A guard ring is a diffusion ring that surrounds the pMOS device. The guard ring has an opposite doping polarity to that of the body, and is reverse biased to isolate the pMOS device. During power-on, if the higher voltage supply is ramped up more slowly than the lower voltage supply, a p-type source/drain junction may be forward biased to an n-type body, which could result in a latch-up, especially if guard rings are not installed.

A well is an isolated body region. In a CMOS circuit, in order to save silicon area, it is desirable to place all pMOS devices in a single n-well and to bias the n-well to a highest voltage level. Accordingly, the n-well is typically tied to a supply having a highest voltage level. If, instead of employing a single n-well, multiple n-wells are employed, then each of the multiple n-wells must be connected to a respective bias, and extra silicon area, as compared to a case of a single n-well, is required to accommodate well-to-well spacing.

However, in order to avoid latch-up, the sharing of wells is often prohibited. In a dynamic random access memory (DRAM), a higher voltage supply is generated from a lower voltage supply by using a charge pump and a voltage regulator. The higher voltage supply is inherently ramped up much latter than the lower voltage supply. DRAMs typically include a boost word supply line (Vpp) for boosting a voltage of a selected word line in order to achieve a proper access time for the selected word line. The boost word supply line Vpp is also typically the highest voltage level in the DRAM, for example, Vdd=1.5 volts and Vpp=3.0 volts. During a power-on sequence, after Vdd is ramped up, there is a delay of about 10 nanoseconds (ns) to 100 ns until the boost word line supply Vpp is ramped up. Since, in order to avoid latch-up, the sharing of wells is prohibited, a larger chip area is required than there would be if shared wells were permitted.

SUMMARY OF THE INVENTION

There is a need for an improved technique for preventing latch-up of a multi-level power supply CMOS system during power-on.

Additionally, there is a need for such a technique that also permits a sharing of wells by pMOS devices.

These and other objects are achieved by a circuit for managing a multi-level power supply. The circuit includes a comparator that compares a voltage level (Vs1) of a lower voltage supply bus to a voltage level (Vs2) of a higher voltage supply bus, and a switch that routes current from the lower voltage supply bus to the higher voltage supply bus if Vs2<Vs1. The comparator is powered by the lower voltage supply bus, the lower and higher voltage supply busses provide power to an apparatus that includes a plurality of p-type metal oxide semiconductor devices in a common well, and the common well is electrically connected to the higher voltage supply bus.

DESCRIPTION OF THE INVENTION

A power supply switch system utilizes a power switch to, under certain circumstances, route current from a lower voltage supply bus to a higher voltage supply bus. More specifically, if the higher voltage supply bus is not ready, e.g., is at a lower voltage level than that of the lower voltage supply bus, the power supply switch system routes current from the lower voltage supply bus to the higher voltage supply bus, thus avoiding latch-up of a CMOS device that is being powered by the voltage supply busses.

A voltage sensor, e.g., a comparator, is associated with the switch module. The comparator senses voltage levels on the supply busses and, based on a relationship between the voltage levels, determines "ON/OFF" states of the power switch. When the higher voltage supply bus is not available or is not ready, the switch is turned ON so that current is routed from the lower voltage supply bus to the higher voltage supply bus. The current continues until the higher voltage supply level is established, and then the switch is turned OFF. The power supply switch system can be extended to accommodate a system having more than two voltage supply levels. Also, the switch and the comparator can be of relatively small size, e.g., less than 0.1% of a semiconductor chip area.

Figure 1A:
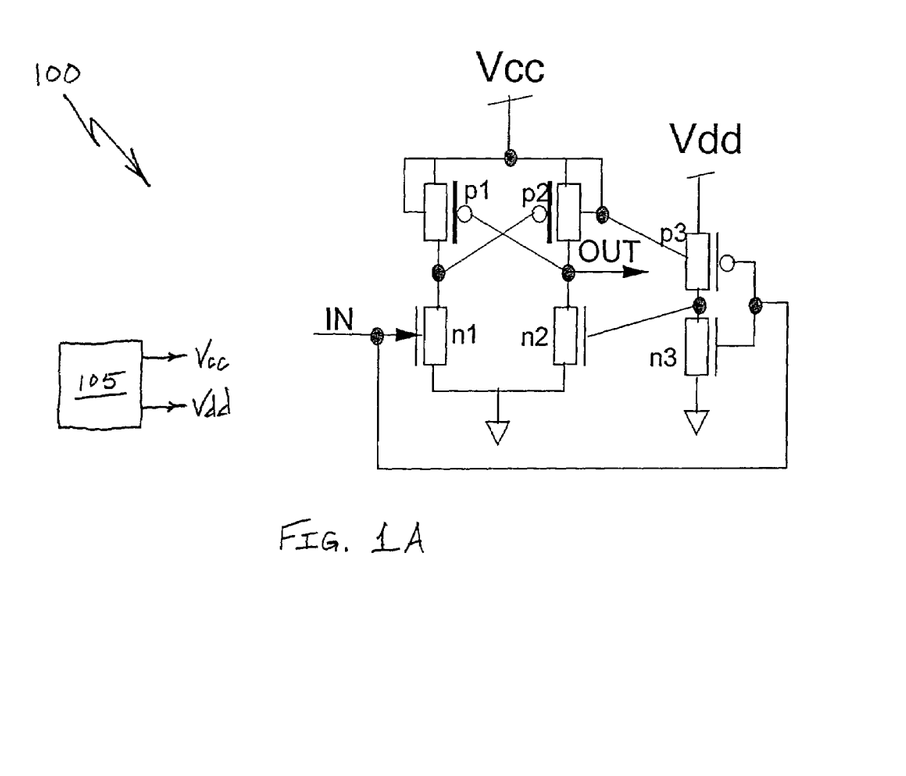
FIG. 1A is a schematic of a level shifter circuit for converting a signal level from Vcc to Vdd, and that includes a power supply switch system for preventing latch-up.

FIG. 1A is a schematic of a level shifter circuit 100, which is designed to shift an input signal level of Vdd to an output signal level of Vcc, where Vdd<Vcc. Circuit 100 includes pMOS devices p1, p2 and p3, and nMOS devices n1, n2 and n3. Circuit 100 also includes a power supply switch system 105 that provides voltage levels Vcc and Vdd to respective voltage busses. For proper operation, circuit 100 requires Vcc>Vdd.

The input signal IN has a voltage swing from ground to Vdd, and is converted to the output signal OUT having a voltage swing from ground to Vcc. During normal operation of circuit 100, Vcc is greater than Vdd, and therefore pMOS devices p1 and p2 are masked by a thick oxide mask 105. pMOS devices p1 and p2 each have a body that is tied to the Vcc bus, and pMOS device p3 has a body tied to the Vdd bus.

Figure 1B:
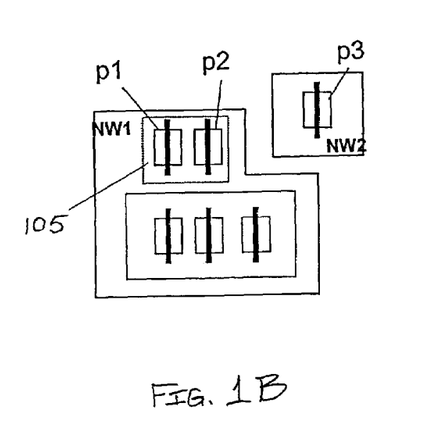
FIG. 1B is an illustration of a portion of the circuit of FIG. 1A showing a possible layout thereof.

FIG. 1B is an illustration of a portion of circuit 100 showing a possible layout thereof. The layout of FIG. 1B has two n-wells, namely n-wells NW1 and NW2. pMOS devices p1 and p2 are located within n-well NW1, which is biased by Vcc, and p-MOS device p3 is located in n-well NW2, which is biased by Vdd.

Figure 1C:
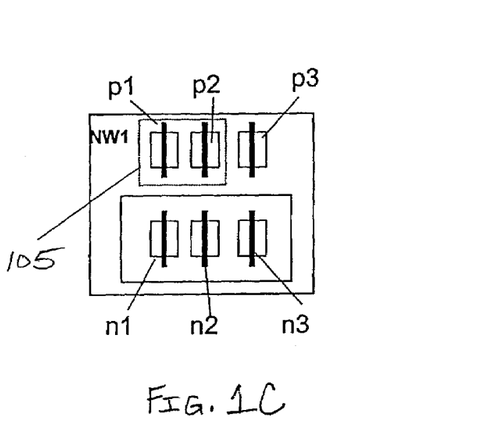
FIG. 1C is an illustration of a portion of the circuit of FIG. 1A showing a possible alternative layout.

FIG. 1C is an illustration of a portion of circuit 100 showing a preferred layout. To save area, as compared to the layout of FIG. 1B, all of pMOS devices p1, p2 and p3 are placed inside one n-well, i.e., n-well NW1, and their bodies are all tied to the Vcc bus. This layout could save area significantly, especially when there are many such mixed voltage circuits.

Power supply switch system 105 ensures that the higher voltage supply bus, in this case the Vcc bus, will, under certain circumstances, receive current from the lower voltage supply bus, i.e., the Vdd bus. Routing of current from the lower voltage supply bus to the higher voltage supply bus avoids p-n junction forward bias within circuit 100, and so, prevents a latch-up of circuit 100. Thus, circuit 100 can be configured with a layout as shown in either of FIG. 1B or 1C.

Figure 2:
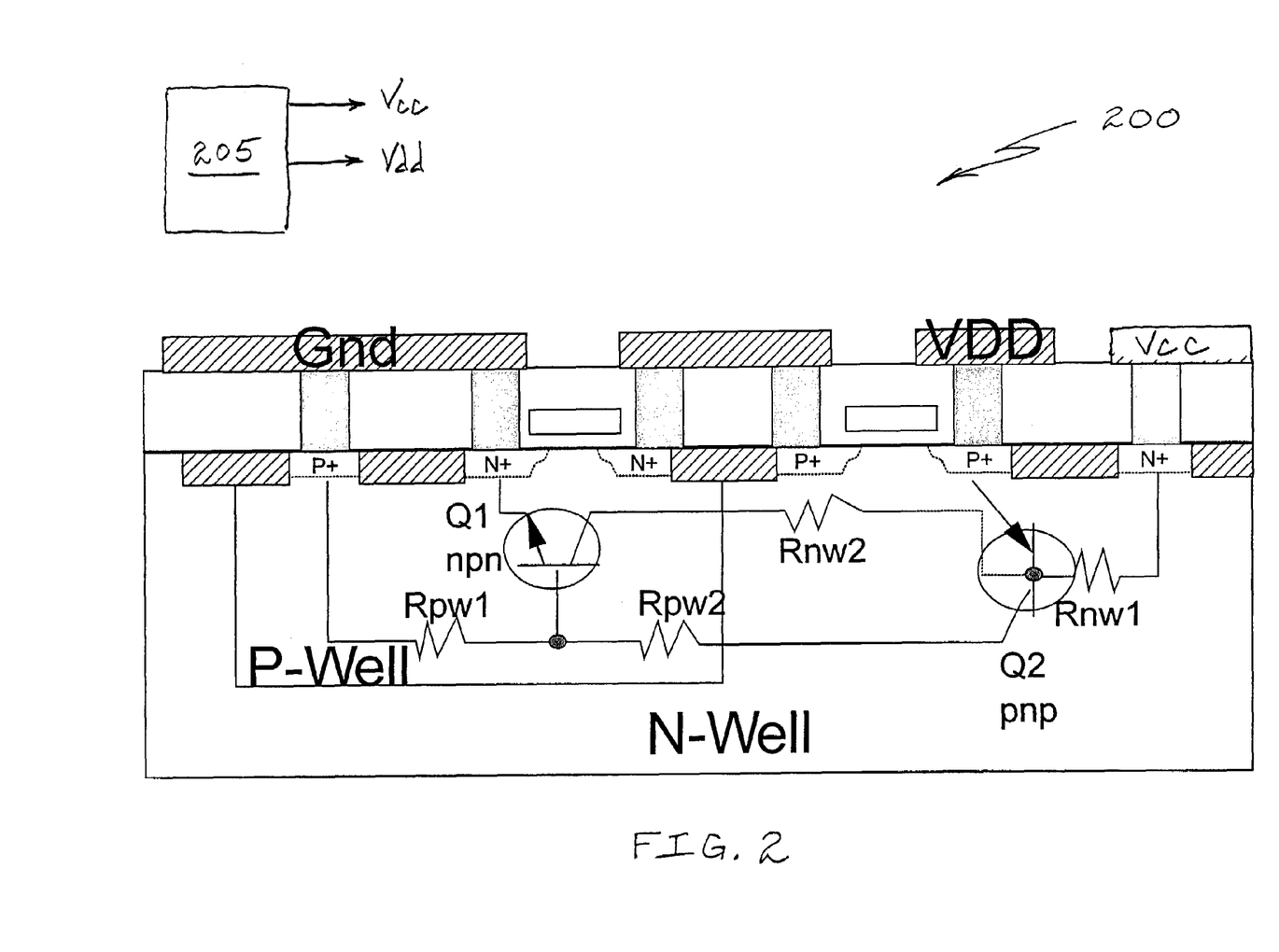
FIG. 2 is an illustration of a circuit in which a CMOS inverter is built in a triple-well, has a parasitic p-n-p-n latch-up path, but includes a power supply switch system for preventing latch-up.

FIG. 2 is an illustration of a circuit 200 in which a CMOS inverter is built in a triple-well. Circuit 200 includes a power supply switch system 205 that provides voltage levels Vcc and Vdd to respective voltage busses.

In circuit 200, to save area, all pMOS devices are located within a common n-well. The n-well is biased to its highest supply, e.g., Vcc. If Vcc were not available, a parasitic pnp bipolar device Q2 would have a forward biased emitter-base junction that would suddenly increase the gain of device Q2 and induce a latch-up. Eventually, a high level of current would flow in a path from the Vdd supply bus, through Q2, and then through Q1 to ground. This path is known as a parasitic p-n-p-n latch-up path. Power supply switch system 205 provides voltages Vcc and Vdd in an orderly manner to prevent the latch-up of circuit 200.

Figure 3A:
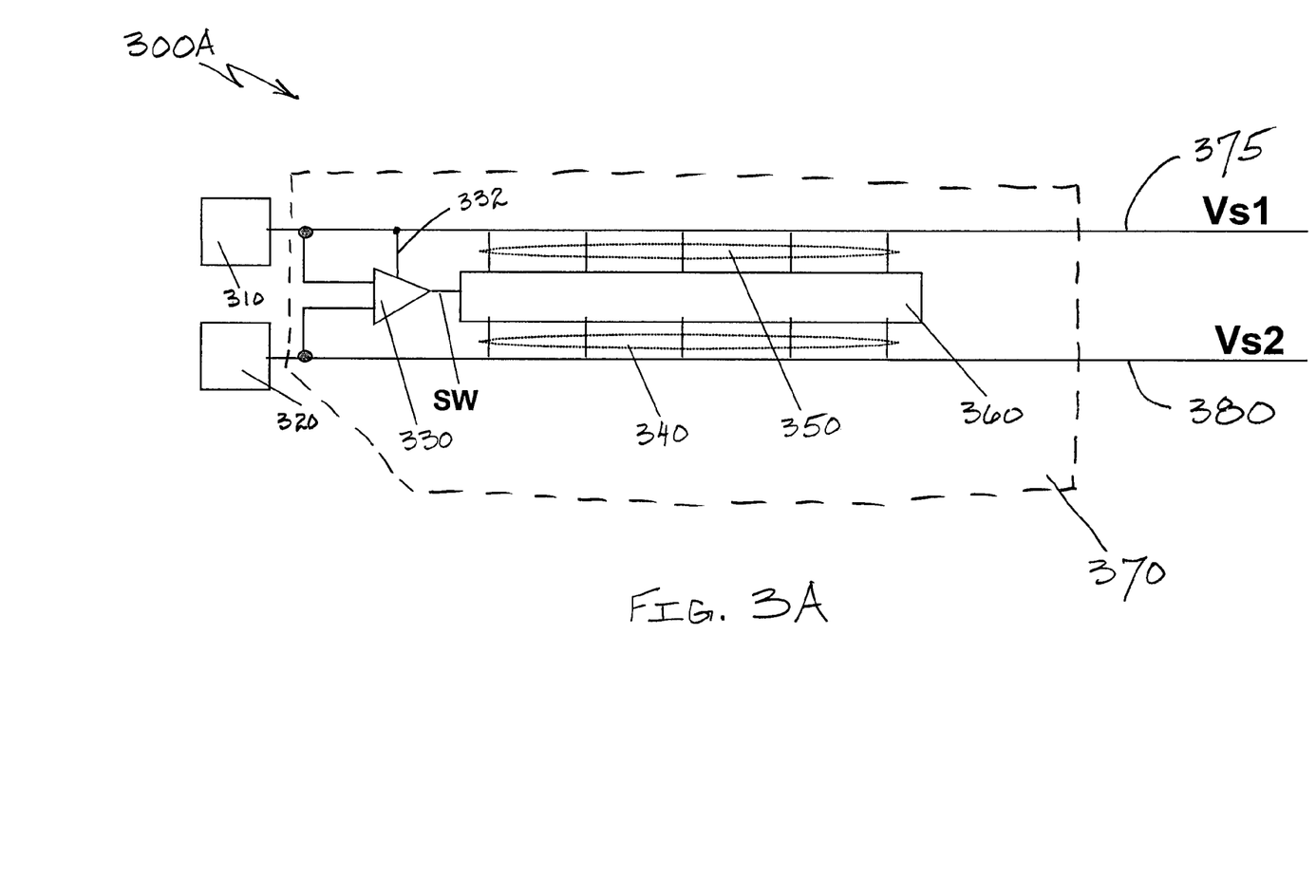
FIG. 3A is a schematic of a microelectronic circuit system that includes a switch module for preventing latch-up, and that receives power from a plurality of independent external power supplies.

FIG. 3A is a schematic of a microelectronic circuit system 300A. System 300A provides voltage levels Vs1 and Vs2 to voltage busses 375 and 380, respectively, where under normal, proper, operating conditions, Vs2 is a higher voltage level than Vs1. System 300A includes a power supply switch system 370 that, in turn, includes a switch module 360, a voltage comparator 330 and two sets of interconnects 340 and 350.

Voltage comparator 330 receives, as inputs, Vs1 and Vs2, and provides an output SW that indicates a relationship between Vs1 and Vs2. When voltage comparator 330 senses that Vs2 is greater than or equal to Vs1, then SW=0. Conversely, when voltage comparator 330 senses that Vs2 is less than Vs1, then SW=1. SW is provided from voltage comparator 330 to switch module 360.

Switch module 360 receives SW and, based on the state of SW, controls whether current is permitted to flow from Vs1 bus 375, through switch module 360, to Vs2 bus 380. If SW=0, then switch module 360 is turned OFF, i.e., opened, and current does not flow from Vs1 bus 375 to Vs2 bus 380. If SW=1, then switch module 360 is turned ON, i.e., closed, and current flows from Vs1 bus 375 through interconnect lines 350, switch module 360 and interconnect lines 340, to Vs2 bus 380. The operation of power supply switch system 370 is summarized in Table 1.

TABLE 1

| Relationship between Vs1 and Vs2 | SW | Switch module 360 | Current Control |
| --- | --- | --- | --- |
| Vs2 ≧ Vs1 | 0 | Opened | Current does not flow from Vs1 bus 375 to Vs2 bus 380 |
| Vs2 < Vs1 | 1 | Closed | Current flows from Vs1 bus 375 to Vs2 bus 380 |

System 300 includes two power supply pads 310 and 320 that represent connections to two separate external power supplies (not shown) for supplying power to Vs1 bus 375 and Vs2 bus 380. By design, Vs2 is intended to be greater than Vs1. However, during power-on, either of Vs1 or Vs2 may be ramped up earlier then the other. That is, the external supply of Vs1 may come up before the external supply of Vs2, or conversely, the external supply of Vs2 may come up before the external supply of Vs1.

Via a connection 332, voltage comparator 330 is powered by the Vs1 bus, and therefore, is not operational until Vs1 is ramped up. If Vs1 ramps up before Vs2, since voltage comparator 330 is powered by the Vs1 bus, voltage comparator 330 will control switch module 360 to route current from Vs1 bus 375 to Vs2 bus 380. However, if Vs2 is ramped up earlier than Vs1, and therefore Vs2 is greater than Vs1, there is no latch-up concern because n-wells are tied to Vs2, and p-n junctions are reverse biased, and so, it does not matter whether switch module 360 is ON or OFF. Furthermore, when Vs1 is subsequently ramped up, since Vs2 is previously ramped up and is greater than Vs1, voltage comparator 330 will ensure that switch module 360 is turned OFF.

Figure 3B:
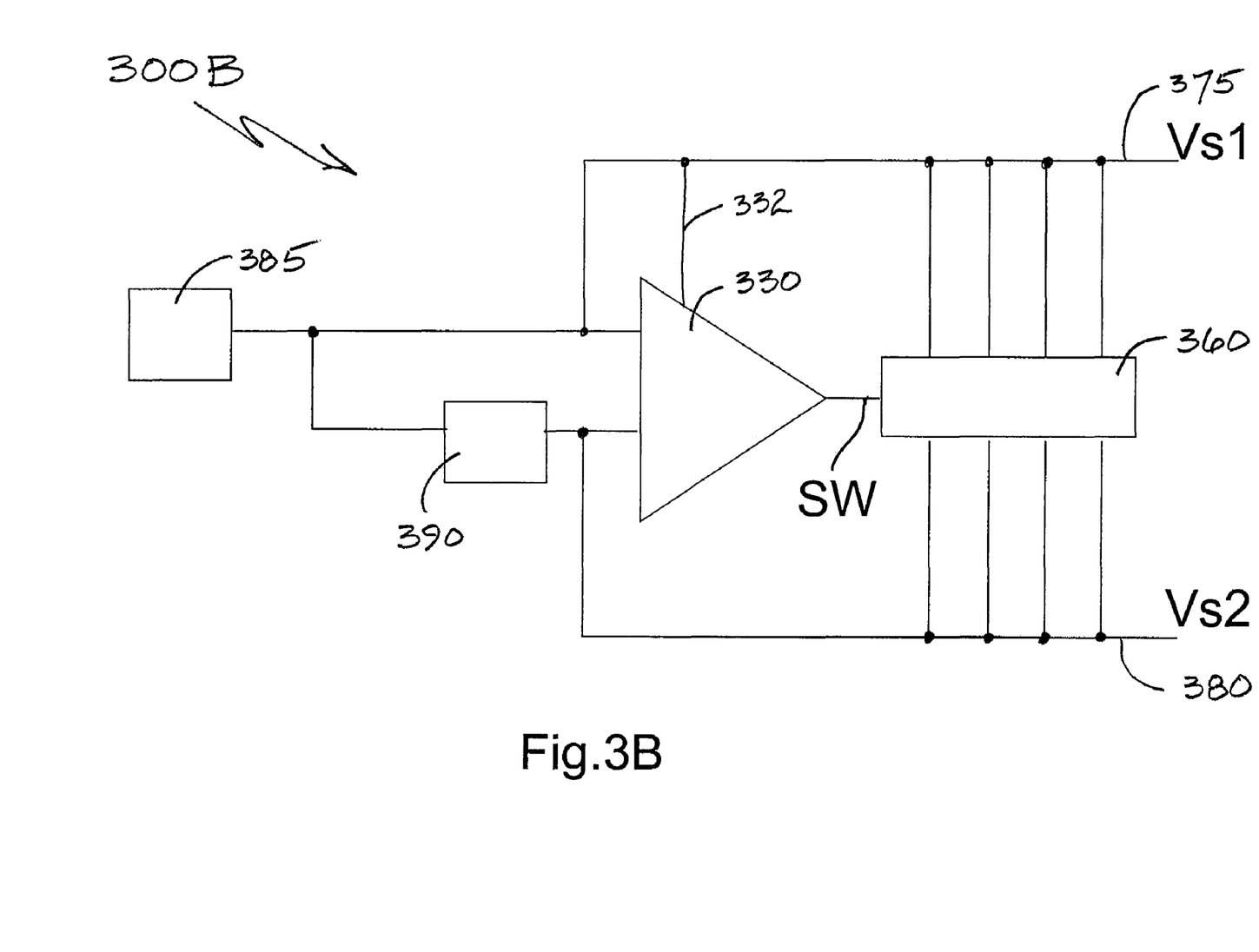
FIG. 3B is a schematic of a microelectronic circuit system that includes a switch module for preventing latch-up, and that receives power from a single external power supply.

FIG. 3B is a schematic of a system 300B, which is similar to system 300A, but employs a single external power supply (not shown) that provides power, via a connection pad 385, to Vs1 voltage bus 375. Voltage level Vs2 is derived from voltage level Vs1 via a voltage generator 390, which may be implemented as a charge pump. Since the external supply provides power to Vs1 bus 375, during a power-on sequence, Vs1 is always ramped up ahead of Vs2. When Vs1 is fully ramped, voltage generator 390 creates Vs2. As in system 300A, under normal, proper, operating conditions, Vs2>Vs1.

In system 300B, since, during power-on, Vs1 is ramped up before Vs2, voltage comparator 330 will be operational and capable of comparing Vs1 to Vs2, even though Vs2 may not yet be present. Voltage comparator 330 provides SW to control switch module 360 to route current from Vs1 bus 375 to Vs2 bus 380 until Vs2 is greater than or equal to Vs1.

In both of system 300A and system 300B, the lower voltage supply bus, i.e., Vs1, powers voltage comparator 330. This ensures, in both of systems 300A and 300B, that if Vs2<Vs1, i.e., the relationship that could lead to a latch-up, voltage comparator 330 will control switch module 360 to route current from Vs1 bus 375 to Vs2 bus 380.

The concept of using a switch module to route current from a first power bus to a second power bus can be extended to a system having more than two power supply levels.

Figure 4:
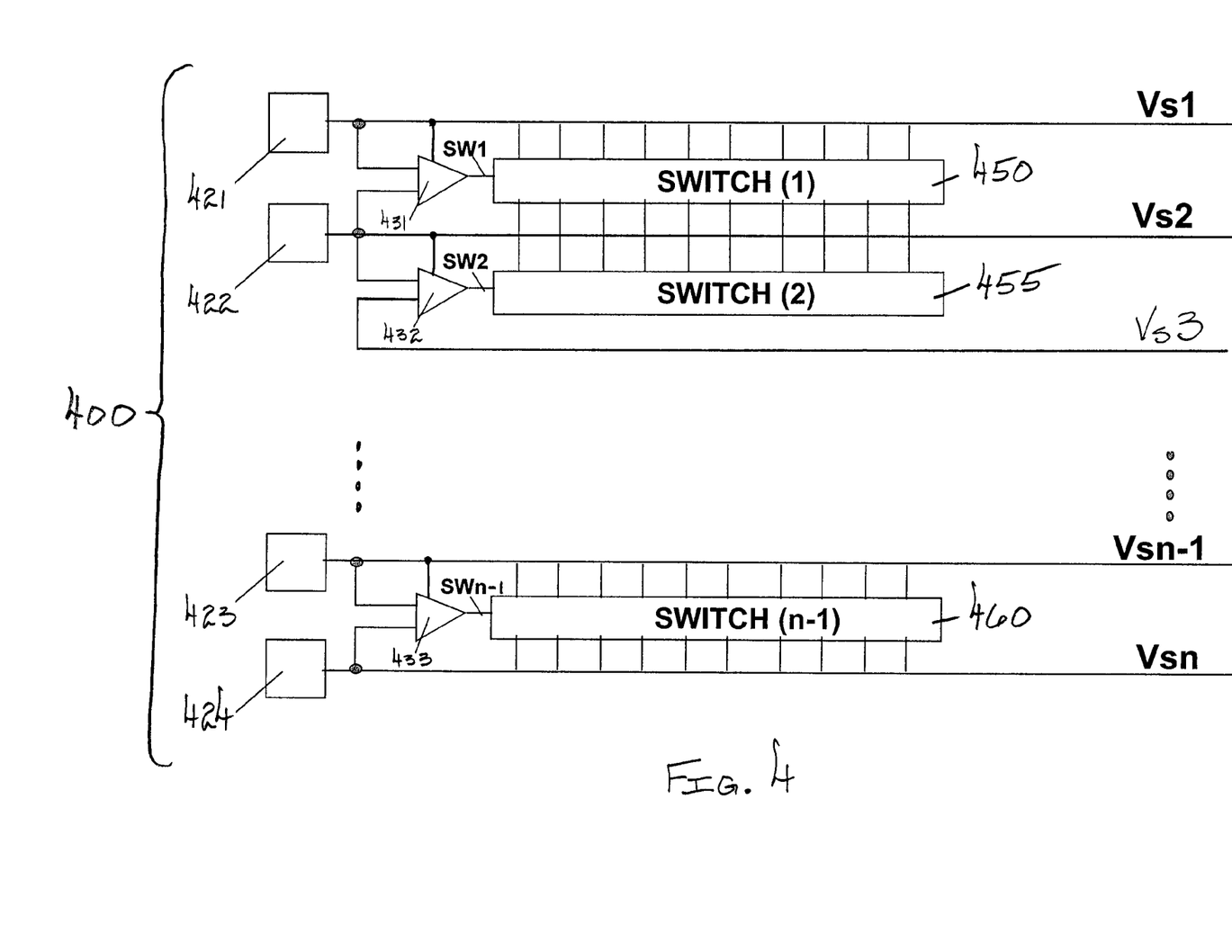
FIG. 4 is a schematic of a system having a plurality, i.e., "n", of supply levels and switch modules for preventing latch-up.

FIG. 4 is a schematic of a system 400 that supplies a plurality, i.e., "n", of supply levels designated as Vs1 through Vsn, to respective voltage supply busses. Power supply pads 421, 422, 423 and 424 provide a connection for system 400 to receive power from power supplies (not shown) for voltage levels Vs1, Vs2, Vsn−1 and Vsn, respectively. A comparator 431 compares voltage levels Vs1 and Vs2, and via an output SW1, controls a switch module 450. A comparator 432 compares voltage levels Vs2 and Vs3, and provides an output SW2 that controls a switch module 455. There are similar comparators and switch modules between adjacent voltage levels up through and including a comparator 433 that compares voltage levels Vsn−1 and Vsn and provides an output SWn−1 for controlling a switch module 460.

During normal operation, Vsn>Vsn−1> . . . Vs2>Vs1, and switch modules 450, 455, . . . 460 are all shut OFF. However, if a comparator that compares voltage levels Vsi and Vsi+1 senses a relationship of Vsi+1<Vsi, where Vsi+1 should be greater than Vsi, then the comparator will turn ON a corresponding switch module to route current from the Vsi bus to the Vsi+1 bus. For example, if Vs3<Vs2, where Vs3 should be greater than Vs2, then comparator 432 will turn ON switch module 455 to route current from the Vs2 bus to the Vs3 bus.

Each of the comparators in system 400 compares voltages from a lower voltage bus and a higher voltage bus, and is powered by the lower voltage bus. For example, (a) comparator 431 compares voltages Vs1 and Vs2, and is powered by the Vs1 voltage bus, (b) comparator 432 compares voltages Vs2 and Vs3, and is powered by the Vs2 voltage bus, and (c) comparator 433 compares voltages Vsn−1 and Vsn, and is powered by the Vsn−1 voltage bus. This ensures that in any case where the higher voltage bus has a lower voltage level than the lower voltage bus, the comparator will be powered to control a switch for routing current from the lower voltage bus to the higher voltage bus.

Figure 5:
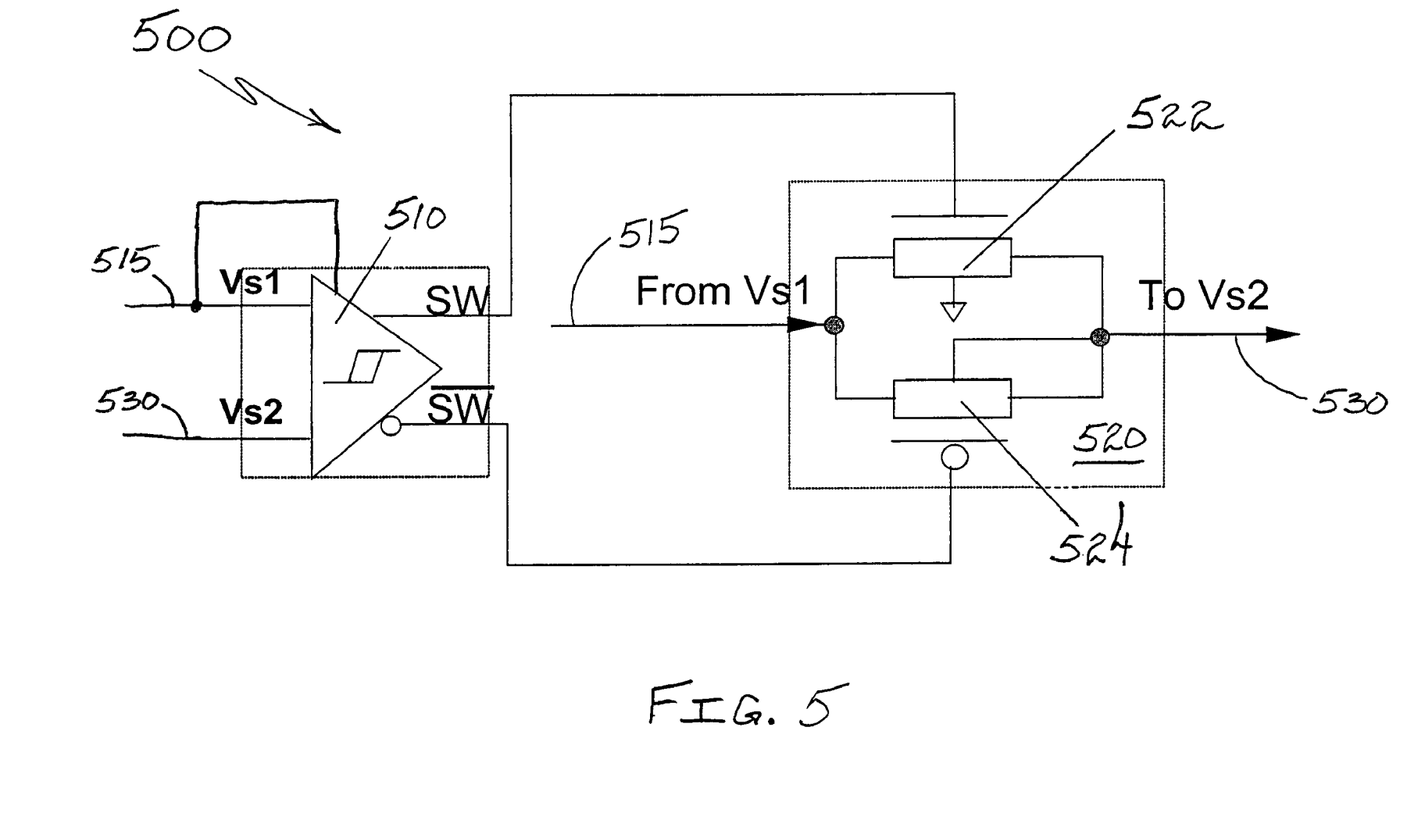
FIG. 5 is a schematic of an embodiment of a CMOS switch module for shorting two supply levels.

FIG. 5 is schematic showing an embodiment of a switch module 500 for routing current from a Vs1 bus 515 to a Vs2 bus 530. A switch module includes a comparator 510 and a transmission gate 520. Comparator 510 is powered by Vs1 bus 515.

Comparator 510 senses and compares voltage levels of Vs1 and Vs2, and is preferably implemented as a hysteresis comparator, that is it employs hysteresis to its inputs to avoid noise spike and false switching. Comparator 510 provides two outputs, SW and /SW, which are logical complements of one another.

Transmission gate 520 includes an n-type device 522 and a p-type device 524. An n-well of p-type device 524 is tied to Vs2 bus 530.

During normal operation, Vs2 is intended to be greater than Vs1. If Vs2 is less than Vs1, then SW=1, current is routed from Vs1 bus 515 to Vs2 bus 530 via n-type device 522 and p-type device 524, and thus, a forward biased junction of p-type device 524 is avoided. On the other hand, if Vs2 is, or becomes, greater than Vs1, then SW=0, and current is not routed from Vs1 bus 515 to Vs2 bus 530 via transmission gate 520. When Vs2 is greater than Vs1, since the n-well of p-type device 524 is tied to Vs2 bus 530, the junction of p-type device 524 is reversed biased, and so, p-type device 524 does not latch-up. Switch module 500 not only prevents a latch-up, but also saves a significant area of silicon because it allows a plurality of pMOS devices to share a common n-well.

Although not illustrated herein, a CMOS circuit can be configured with a plurality on n-type devices with bodies tied to a common p-well. A power supply switch system could also be employed to manage voltage levels in such a CMOS circuit. The power supply switch system would compare voltage levels of a first voltage bus and a second voltage bus, and based on a relationship of the voltage levels, control a switch to route current from the first voltage bus to the second voltage bus.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A circuit comprising:
   a comparator that compares a voltage level (Vs1) of a lower voltage supply bus to a voltage level (Vs2) of a higher voltage supply bus; and
   a switch that routes current from said lower voltage supply bus to said higher voltage supply bus if Vs2<Vs1,
   wherein said comparator is powered by said lower voltage supply bus,
   wherein said lower and higher voltage supply busses provide power to an apparatus that includes a plurality of p-type metal oxide semiconductor devices in a common well, and
   wherein said common well is electrically connected to said higher voltage supply bus.

2. The circuit of claim 1, wherein said switch routes said current until Vs2≧Vs1.

3. The circuit of claim 1, wherein said apparatus is a complementary metal oxide semiconductor (CMOS) circuit.

4. The circuit of claim 1,
   wherein said lower voltage supply bus is a first voltage supply bus, wherein said higher voltage supply bus is a second voltage supply bus, and wherein said circuit further comprises:
- a comparator that compares Vs2 to a voltage level (Vs3) of a third voltage supply bus; and
- a switch that routes current from said second voltage supply bus to said third voltage supply bus if Vs3<Vs2.

5. The circuit of claim 4,
wherein said third voltage supply bus also provides power to said apparatus, and
wherein said apparatus operates with Vs3>Vs2>Vs1.

6. The circuit of claim 1, wherein said comparator has inputs for sensing Vs1 and Vs2, and employs hysteresis to said inputs.

* * * * *